US008979565B2

(12) United States Patent
Yeh

(10) Patent No.: US 8,979,565 B2
(45) Date of Patent: Mar. 17, 2015

(54) ELECTRICAL CONNECTOR HAVING A HOLDING MEMBER AND A LOAD PLATE PIVOTALLY ASSEMBLED TO TWO ENDS OF A STIFFENER

(71) Applicant: Hon Hai Precision Industry Co., Ltd., New Taipei (TW)

(72) Inventor: Cheng-Chi Yeh, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 62 days.

(21) Appl. No.: 13/846,910

(22) Filed: Mar. 18, 2013

(65) Prior Publication Data
US 2013/0344713 A1 Dec. 26, 2013

(30) Foreign Application Priority Data
Jun. 25, 2012 (TW) .............................. 101122577 A

(51) Int. Cl.
H01R 13/62 (2006.01)
H01R 12/88 (2011.01)
H05K 7/10 (2006.01)

(52) U.S. Cl.
CPC .............. *H01R 12/88* (2013.01); *H05K 7/1061* (2013.01)
USPC ....................................................... 439/331

(58) Field of Classification Search
USPC ............................... 439/331, 330, 67, 73, 342
See application file for complete search history.

(56) References Cited

U.S. PATENT DOCUMENTS

| 6,261,114 | B1 | 7/2001 | Shimada |
| 6,932,622 | B2* | 8/2005 | Liao et al. ........................ 439/73 |
| 6,957,973 | B1* | 10/2005 | McHugh et al. ............... 439/331 |
| 7,029,309 | B2* | 4/2006 | Ma ................................. 439/331 |
| 8,506,316 | B2* | 8/2013 | Tsai et al. ..................... 439/331 |
| 2013/0183849 | A1* | 7/2013 | Tsai et al. ..................... 439/366 |

FOREIGN PATENT DOCUMENTS

| CN | 2909626 | 6/2007 |
| CN | 1992450 A | 7/2007 |
| CN | 2932756 Y | 8/2007 |
| CN | 201887186 | 6/2011 |
| CN | 201937122 | 8/2011 |
| JP | 2000340325 A | 12/2000 |
| TW | M429214 | 5/2012 |

* cited by examiner

*Primary Examiner* — Chandrika Prasad
(74) *Attorney, Agent, or Firm* — Wei Te Chung; Ming Chieh Chang

(57) ABSTRACT

An electrical connector for electrically connecting an IC package with a substrate and includes an insulative housing with a plurality of contacts received therein, a stiffener located outside of the insulative housing, a holding member and a load plate pivotally assembled to the stiffener, the stiffener includes a first end and a second end opposite to the first end, the holding member is pivotally assembled to the first end of the stiffener for holding and assembling the IC package to the insulative housing, the load plate is configured to frame shape and is pivotally assembled to the second end of the stiffener.

20 Claims, 7 Drawing Sheets

US 8,979,565 B2

ELECTRICAL CONNECTOR HAVING A HOLDING MEMBER AND A LOAD PLATE PIVOTALLY ASSEMBLED TO TWO ENDS OF A STIFFENER

BACKGROUND OF THE INVENTION

1. Field of the Invention

The present invention relates to an electrical connector with carrier assembled thereto for assembling IC package, and more particularly to an electrical connector to electrically connect an IC package to a printed circuit board.

2. Description of Related Art

U.S. Pat. No. 7,677,912 discloses an electrical connector related to the instant invention for use to electrically connect an IC package, including an insulative housing with the conductive terminals received therein, the fastener surrounding the housing and the cover and the levers both of which pivotally mounted to the cover. During operation, the user initially rotates the opening lever, ant rotates to open the cover, and loads the IC package into the housing to contact the terminals, and rotates to close the cover, and rotates the locking lever to press downwardly against the cover so as to have the cover press downwardly against the IC package, thus assuring preferred connection between the IC package and the terminals.

The foregoing operation process, it is required to manually load the IC package to the housing, and during the load/unloading procedure, it is possible to damage the terminals due to fault operation.

SUMMARY OF THE INVENTION

Accordingly, an object of the present invention is to provide an electrical connector which is easy to load the IC package therein.

According to one aspect of the present invention, an electrical connector for electrically connecting an IC package with a substrate and includes an insulative housing with a plurality of contacts received therein, a stiffener located outside of the insulative housing, a holding member and a load plate pivotally assembled to the stiffener, the stiffener includes a first end and a second end opposite to the first end, the holding member is pivotally assembled to the first end of the stiffener for holding and assembling the IC package to the insulative housing, the load plate is configured to frame shape and is pivotally assembled to the second end of the stiffener. The holding member is used to actuate the IC package to move, thus loading the IC package to the housing.

Compared with the prior arts, the instant invention uses the holding member to carry the IC package to move together for loading the IC package to the housing, thus facilitating loading of IC package.

DETAILED DESCRIPTION OF THE INVENTION

Figure 1:
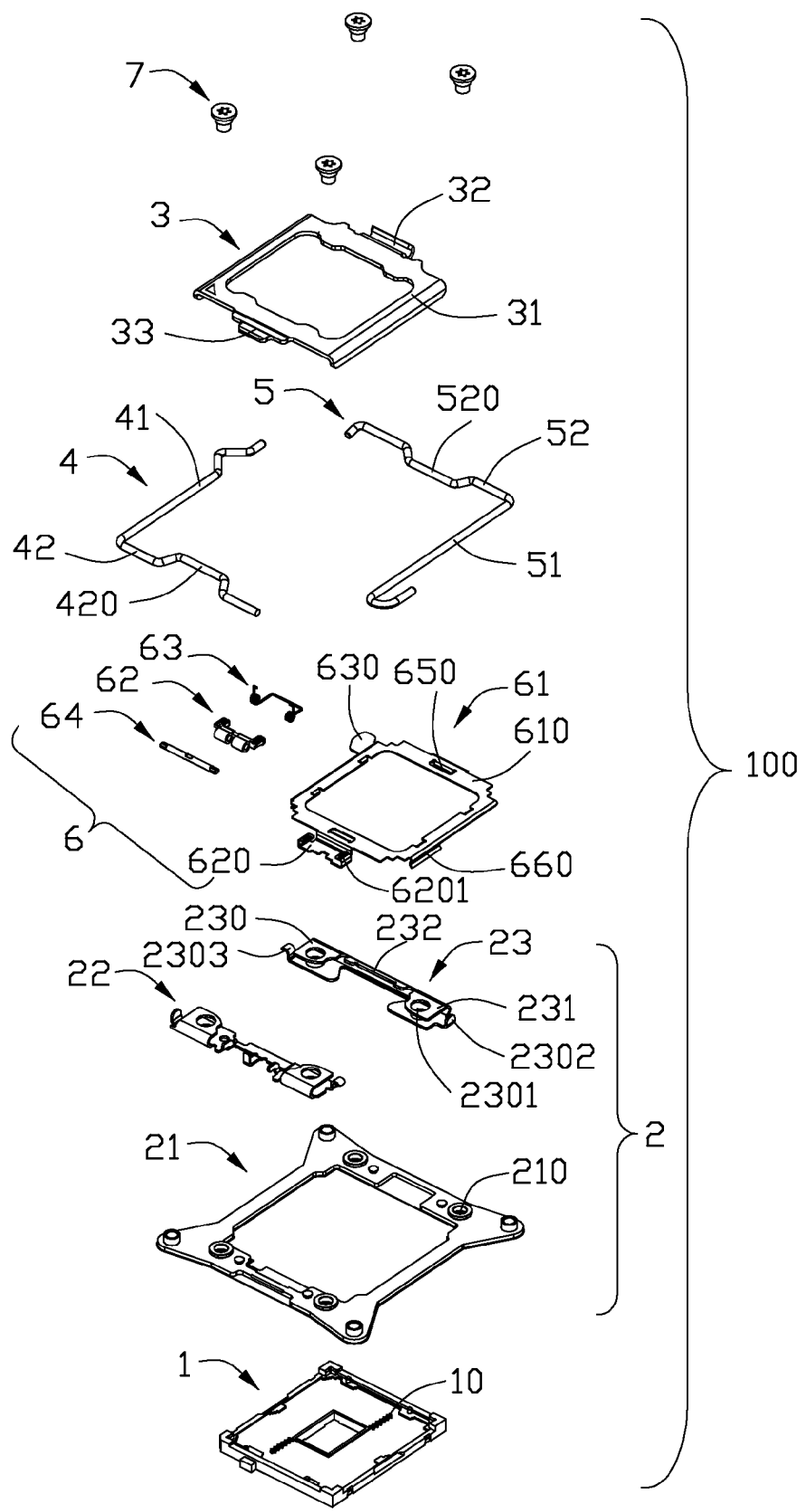
FIG. 1 is an exploded view of an electrical connector according to a preferred embodiment of the present invention.
Figure 7:
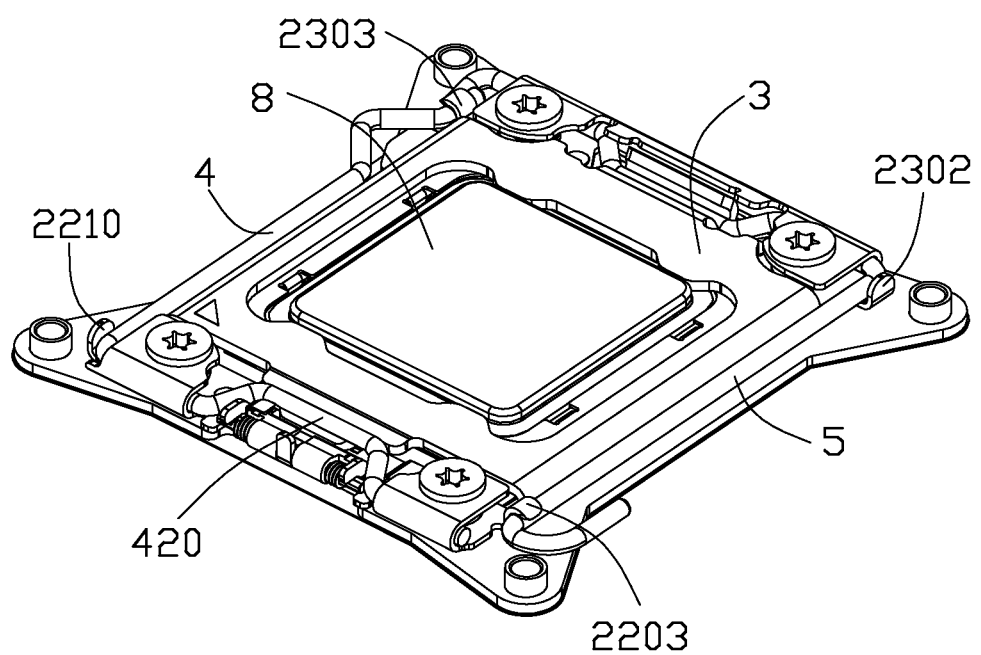
FIG. 7 is similar to FIG. 6, wherein the carrier with the IC package and the load plate both in a closed position.

FIGS. 1 and 7 illustrates an electrical connector 100 in accordance to a preferred embodiment of the present invention, the electrical connector 100 is used for electrically connecting an IC package 8 with a substrate (not labeled). The electrical connector 100 comprises an insulative housing 1 defining opposite first and second end region (not labeled) and equipped with a plurality of contacts 10 received therein, a stiffener 2 locates outside the insulative housing 1, a first lever 4 and a second lever 5 assembled to opposite ends of the stiffener 2, a load plate 3 and a holding member 6 assembled to the stiffener 2.

Figure 2:
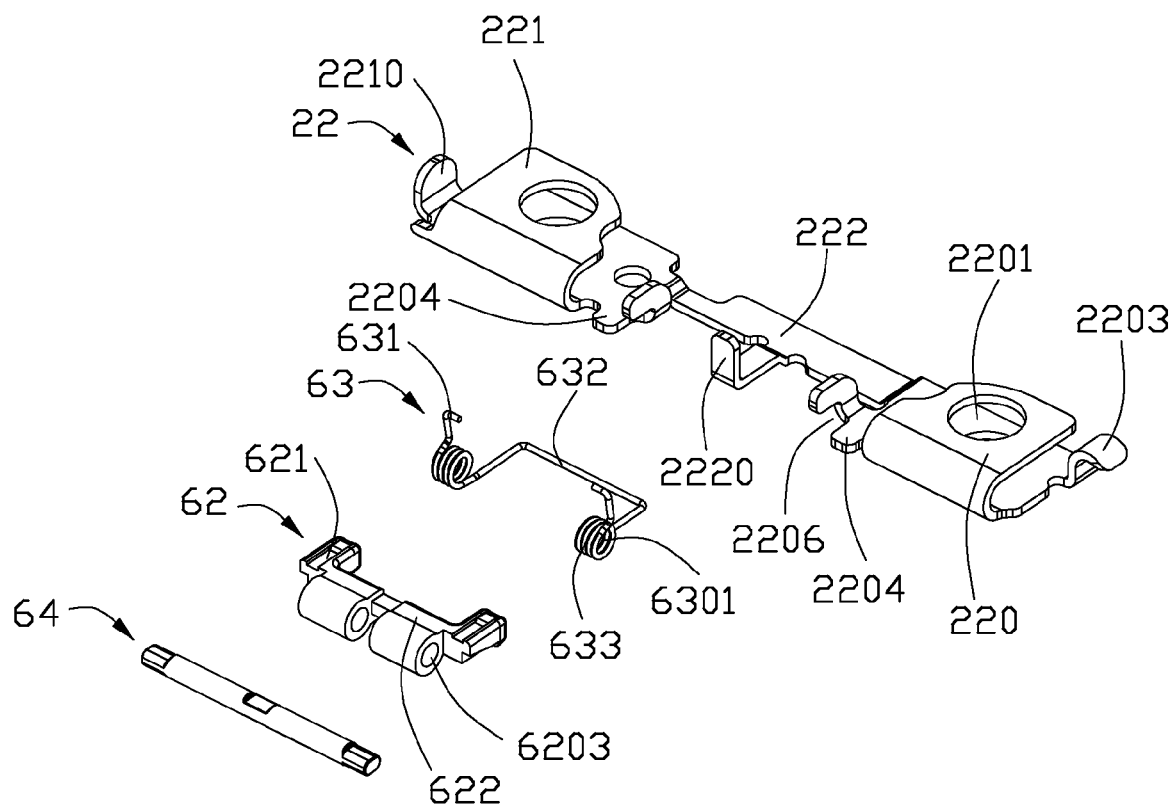
FIG. 2 is an exploded view of part members of the electrical connector as shown in FIG. 1.

Referring to FIGS. 1 and 2, the stiffener 2 comprises a first end (not labeled) and a second end (not labeled) opposite to the first end. The holding member 6 and the first lever 4 are assembled to the first end, and the load plate 3 and the second lever 5 are assembled to the second end. The stiffener 2 comprises a frame 21 located around the insulative housing 1, a first retention member 22 around the first end region of the housing and a second retention member 23 around the second end region of the housing, and respectively assembled to the opposite ends of the frame 21. The frame 21 includes a plurality of retention holes 210.

The first retention member 22 comprises a first part 220 roughly configured with the "⌐" shape, a second part 221 and a first connection portion 222 connecting the first part 220 and the second part 221. The first part 220 comprises a first interlock portion 2203 extending downwardly. The second part 221 comprises a first resist portion 2210 extending upwardly. The first interlock portion 2203 is used for interlocking with the second lever 5. The first resist portion 2210 is used to prevent the horizontal movement of the first lever 4. The first part 220 and the second part 221 both comprises a plurality of position holes 2201 corresponding to the retention holes 210 of the frame 21. The first part 220 and the second part 221 both includes a first restrict portion 2204 with U shape near the first connection portion 222. The first restrict portion 2204 includes a receiving opening 2206. The first connection portion 222 includes a second restrict portion 2220 with L shape.

The second retention member 23 comprises a third part 230 roughly configured with the "⌐" shape, a fourth part 231 and a second connection portion 232 connecting the third part 230 and the fourth part 231. The third retention member 230 comprises a second interlock portion 2303. The fourth part 231 comprises a second resist portion 2302. The third part 230 and the fourth part 231 both comprises a plurality of position holes 2301 corresponding to the retention holes 210 of the frame 21. The second interlock portion 2303 is used for interlocking with the first lever 4. The second resist portion 2302 is used to prevent the horizontal movement of the second lever 5.

Referring to FIG. 1 and FIG. 7, the first lever 4 is assembled to the first retention member 22. The first lever 4 comprises a fix lever or a first pivot shaft 42 and an operation lever 41 perpendicular to the fix lever 42. The fix lever 42 is fixed to the first part 220 and the second part 221. The fix lever 42 includes a press portion 420 in the middle thereof. The second lever 5 has a similar shape with the first lever 4 and is fixed to the second retention member 23. The second lever 5 comprises a fix part or a second pivot shaft 52 and an operation part 51 perpendicular with the fix part 52. The fix part 52 is fixed to the third part 230 and the fourth part 231. The fix part 52 includes an interlock part 520 in the middle thereof. In this embodiment, the load plate 3 is made of metal material and comprises a main portion 31 with frame shape, a first tongue portion 33 and a second tongue portion 32 extending from opposite ends of the main portion 31. The second tongue portion 32 interlocks with the interlock part 520 of the second lever 5. The press portion 420 of the first lever 4 presses on the first tongue portion 33.

Figure 5:
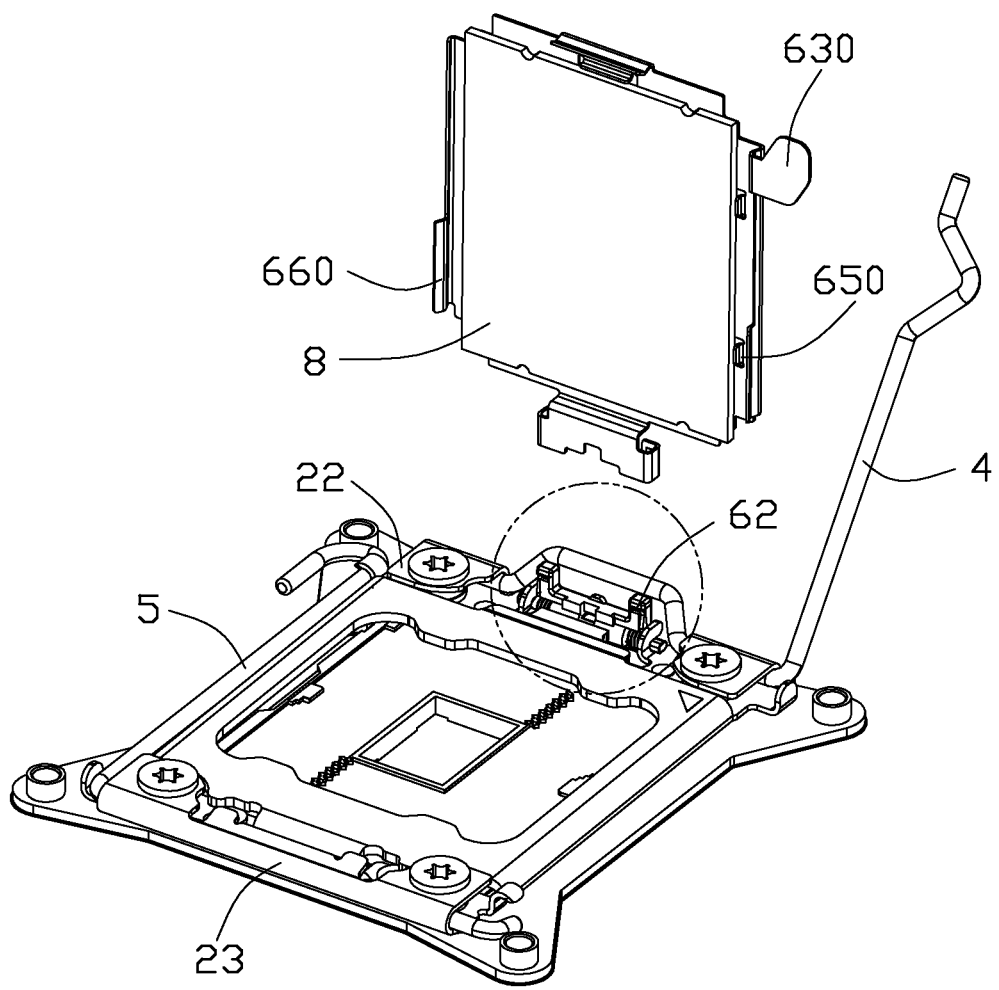
FIG. 5 is assembled view of the electrical connector as shown in FIG. 1, wherein the carrier with the IC package not assembled to the rotated member.

Referring to FIGS. 1 and 5, the holding member 6 comprises a rotated member 62 assembled to the first end of the stiffener 2, a torsion spring member 63 located between the rotated member 62 and the stiffener 2, a (third pivot) shaft 64 for assembling the rotated member 62 and the spring member 63 to the stiffener 2, and a carrier 61 assembled to the rotated member 62 for holding the IC package 8.

The rotated member 62 comprises a body portion 622, a pair of posts 621 extending from opposite ends of the body portion 622. The body portion 622 comprises a position hole 6203. Each of the posts 621 comprises a recess 6210. The spring member 63 comprises a first supporting portion 632, a retention portion 633 extending from opposite ends of the first supporting portion 632 and a second supporting portion 631 extending from the retention portion 633. The retention portion 633 defines a through hole 6301.

Figure 3:
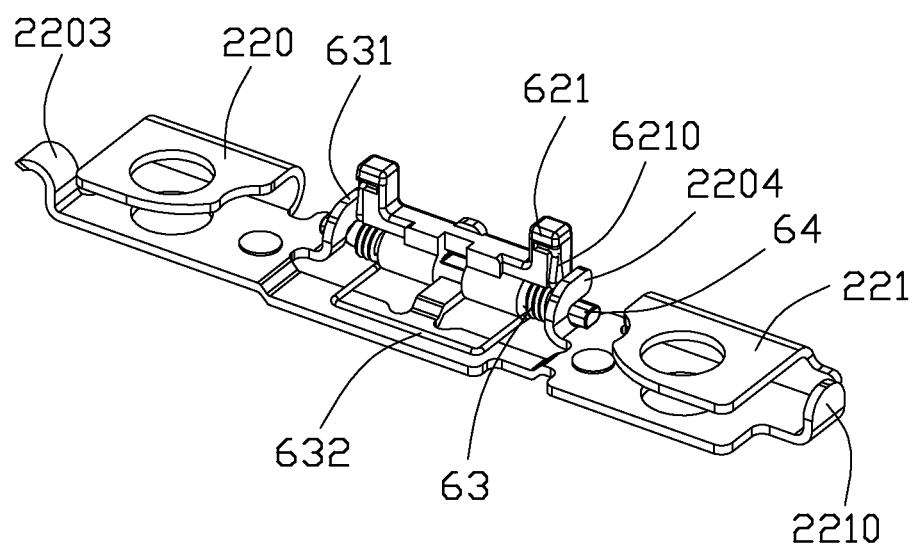
FIG. 3 is an assembled view of the part members as shown in FIG. 2.
Figure 4:
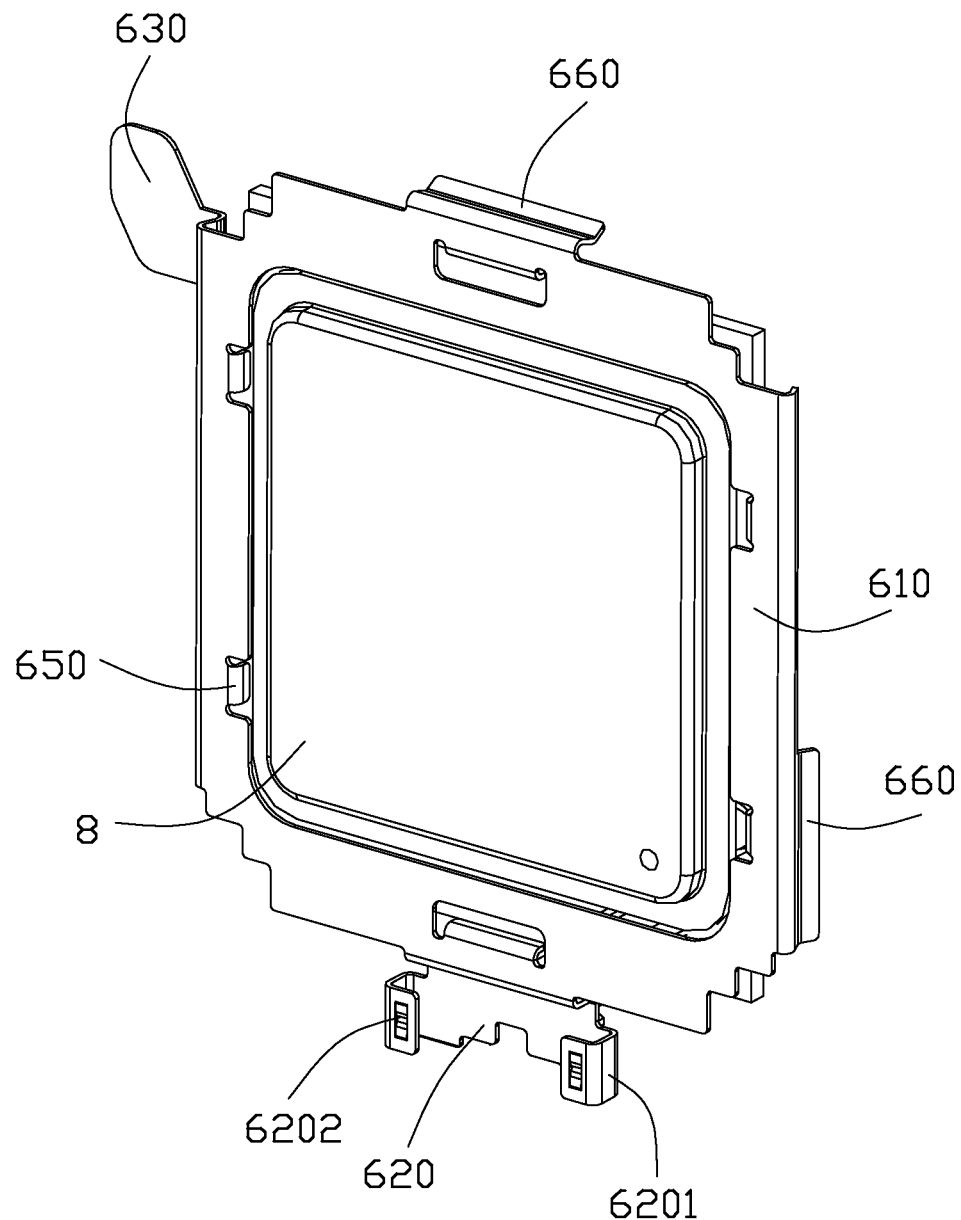
FIG. 4 is assembled view of an IC package and the carrier as shown in FIG. 1.

Referring to FIG. 3, after assembled, the shaft 64 goes through the position hole 6203 of the rotated member 62 and the through hole 6301 of the spring member 63, the two ends of the shaft 64 receives in the receiving opening 2206 of the first restrict portion 2204 of the first retention member 22, which to prevent the shaft 64 escaping from the first retention member 22 in a up to direction and a right direction, the middle of the shaft 64 is restricted by the second restrict portion 2220 to prevent the shaft 64 escaping from the first retention member 22 in s downwardly and left direction, then to position the rotated member 62 and the spring member 63 on the first retention member 22. The first supporting portion 632 of the spring member 63 supported by the first connection portion 222 of the first retention member 22, the second supporting portion 631 are received in the recess 6210 of the rotated member 62. When there is a force exerted on the rotated member 62, the rotated member 62 presses the second supporting portion 631. The force produced by the distortion of the second supporting portion 631 make the rotated member 62 rotated to the original position. The second restrict portion 2220 of the first connection portion 222 locates on one side of the rotated member 62 to prevent the rotated member 62 rotating excessively.

The carrier 61 comprises a main portion 610 with frame shape, a guiding portion 660 extending downwardly from the main portion 610, an operation portion 630 and a fix portion 620 extending outwardly from the main portion 610. The main portion 610 comprises a plurality of position portions 650 forming a space to receive the IC package 8. The fix portion 620 comprises a receiving portion 6201 configured with "⊏" shape. The receiving portion 6201 comprises a spring tab 6202. The receiving portion 6201 matches with the post 621 of the rotated member 62, the spring tab 6202 presses on the post 621 to make the post 621 receive in the receiving portion 6201 securely.

Referring to FIG. 5, When the electrical connector 100 is assembled, the rotated member 62 and the spring member 63 are positioned on the first retention member 22 through the shaft 64; the first lever 4 is fixed to the first retention member 22; the screw 7 goes through the position holes 2201 of the first retention member 22 and the retention holes 210 of the frame 21 to fix the first retention member 22 on the frame 21; the second tongue portion 32 of the load plate 3 is fixed to the interlock part 520 of the second lever 5; the second lever 5 is fixed to the second retention member 23; the screw 7 goes through the position holes 2301 of the second retention member 23 and the retention holes 210 of the frame 21 to fix the second retention member 23 on the frame 21.

This is only one embodiment of this invention, not to limit this invention, for example the first retention member 22, the second retention member 23 and the frame 21 also can be set in a whole member, the load plate 3 and the carrier 61 are fixed to the frame 21.

Figure 6:
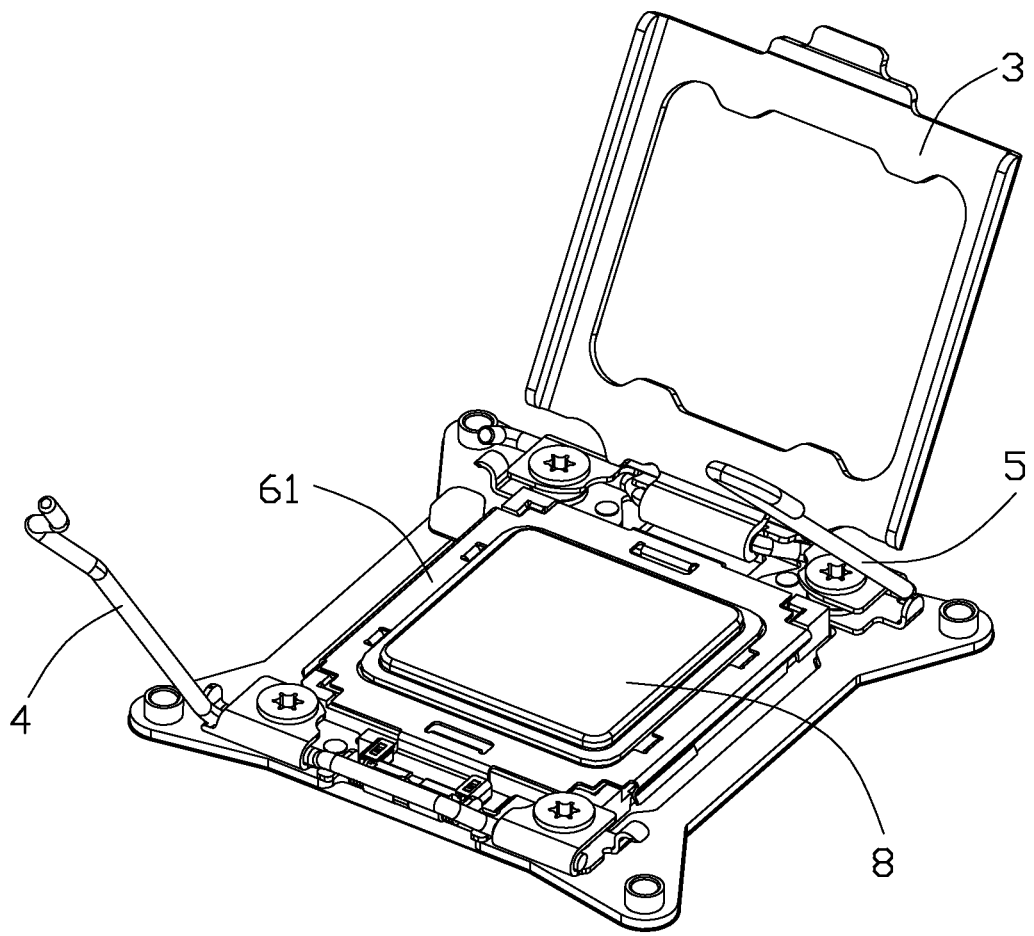
FIG. 6 is assembled view of the electrical connector as shown in FIG. 1, wherein the carrier with the IC package is in a closed position and the load plate is in an opened position.

Referring to FIGS. 5-7, when the electrical connector 100 is used, the IC package 8 is pasted on the carrier 61 or positioned on the carrier 61 through other method; position the carrier 61 on the rotated member 62; rotate the first lever 4, the second lever 5, the load plate 3 and the carrier 61 to an opened position; press the operation portion 630 of the carrier 61 to make the carrier 61 rotated to a closed position and assemble the IC package 8 to the insulative housing 1, the guiding portion 660 of the carrier 61 locates on the outside of the insulative housing 1 to make the IC package 8 connect with the contacts 10 of the insulative housing 1 accurately; rotate the load plate 3, the first lever 4 and the second lever 5 to a closed position, the operation part 51 of the second lever 5 interlocks with the first interlock portion 2203 of the first retention member 22, the operation lever 41 of the first lever 4 interlocks with the second interlock portion 2303 of the second retention member 23, the press portion 420 of the first lever 4 presses on the first tongue portion 33 of the load plate 3 to provide a force on the IC package 8, and a robust electrical connection is established between the IC package 8 and the contacts 10.

The electrical connector 100 includes a carrier 61 for holding the IC package 8, the carrier 61 rotated to the closed position to assembled the IC package 8 to the insulative housing 1 accurately, it is easy to assemble the IC package 8; the electrical connector 100 also comprises a rotated member 62 assembled to the stiffener 2, when need to assemble the IC package 8, only need to assemble the carrier 61 with the IC package 8 to the rotated member 62, it is easy to operate.

PART NUMBER DESCRIPTION

| | |
|---|---|
| Electrical connector 100 | Insulative housing 1 |
| Contact 10 | Stiffener 2 |
| Frame 21 | Retention hole 210 |
| First retention member 22 | First part 220 |
| Position hole 2201 | First interlock portion 2203 |
| First restrict portion 2204 | Receiving opening 2206 |
| Second part 221 | First resist portion 2210 |
| First connection portion 222 | Second restrict portion 2220 |
| Second retention member 23 | Third part 230 |
| Position hole 2301 | Second resist portion 2302 |
| Second interlock portion 2303 | Fourth part 231 |
| Second connection portion 232 | Load plate 3 |
| Main portion 31 | Tongue portion 32 |
| tongue portion 33 | First lever 4 |
| Operation lever 41 | First fix lever 42 |
| The press portion 420 | Lever 5 |
| Operation part 51 | Fix part 52 |
| Interlock part 520 | Holding member 6 |
| Carrier 61 | Main portion 610 |
| Rotated member 62 | Body portion 622 |
| Fixing portion 620 | Position hole 6203 |
| Spring tab 6202 | Operation portion 630 |

-continued

| | |
|---|---|
| Post 621 | Recess 6210 |
| Spring member 63 | Through hole 6301 |
| Second supporting portion 631 | First supporting portion 632 |
| Retention portion 633 | Shaft 64 |
| Position portion 650 | Guiding portion 660 |
| Screw 7 | IC package 8 |

What is claimed is:

1. An electrical connector for electrically connecting an IC package with a substrate, comprising:
    an insulative housing;
    a plurality of contacts received in the insulative housing;
    a stiffener located outside of the insulative housing and comprising a first end and a second end opposite to the first end;
    a holding member pivotally assembled to the first end of the stiffener for holding and assembling the IC package to the insulative housing; and
    a load plate with frame shape and being pivotally assembled to the second end of the stiffener.

2. The electrical connector as claimed in claim 1, wherein the load plate comprises a main portion with frame shape and a first tongue portion extending from opposite ends of the main portion, the electrical connector further comprises a first lever pivotally assembled to the first end of the load plate, the first lever presses on the first tongue portion of the load plate.

3. The electrical connector as claimed in claim 1, wherein the holding member comprises a rotated member pivotally assembled to the first end of the stiffener and a carrier detachably assembled to the rotated member for holding the IC package.

4. The electrical connector as claimed in claim 3, wherein the rotated member comprises a body portion and a pair of posts extending from opposite ends of the body portion, there is an angle between the post and the body portion, the carrier comprises a receiving portion matching with the post to position the carrier on the rotated member.

5. The electrical connector as claimed in claim 4, wherein the receiving portion is configure with "⊏" shape and comprises a spring tab, the spring tab presses on the post to make the post received in the receiving portion securely.

6. The electrical connector as claimed in claim 4, wherein the carrier comprises a main portion with frame shape, a guiding portion extending downwardly from the main portion and a fix portion extending outwardly from the main portion, the receiving portion is set on the fix portion, when the carrier with the IC package is rotated to a closed position, the guiding portion locates on the outside of the insulative housing to assemble the IC package accurately.

7. The electrical connector as claimed in claim 6, wherein the carrier further comprises an operation portion extending outwardly from the main portion, the carrier is rotated to a closed position by a force exerted on the operation portion.

8. The electrical connector as claimed in claim 4, wherein the holding member further comprises a spring member located between the rotated member and the stiffener.

9. The electrical connector as claimed in claim 8, wherein the holding member further comprises a shaft to position the rotated member and the spring member to the stiffener, the body portion of the rotated member includes a position hole for receiving the shaft.

10. The electrical connector as claimed in claim 9, wherein the stiffener comprises a first restrict portion with U shape and a second restrict portion with L shape, the first restrict portion and the second restrict portion fix the shaft on the stiffener securely.

11. An electrical connector assembly comprising:
    an insulative housing defining opposite first and second end regions in a front-to-back direction;
    a plurality of contacts disposed in the housing;
    a stiffener including portions located beside said opposite first and second end regions of the housing, respectively;
    a first lever defining a first pivot shaft pivotally mounted to the stiffener around the first end region and extending along a transverse direction perpendicular said front-to-back direction;
    a second lever defining a second pivot shaft pivotally mounted to the stiffener around the second end region and extending along the transverse direction;
    a load plate having a first end pivotally mounted to the first pivot shaft and a second end adapted to be downwardly pressed by the second pivot shaft; and
    a holding member defining a third pivot shaft pivotally mounted to the stiffener around one of said first end region and said second end region and extending along the transverse direction; wherein
    said holding member is configured to secure an IC (Integrated Circuit) package thereon and to be located under the load plate.

12. The electrical connector as claimed in claim 11, wherein said holding member is pivotally mounted around the second end region.

13. The electrical connector as claimed in claim 12, wherein the holding member includes a rotated member pivotally mounted around the second end region and a carrier discrete from the rotated member and attached upon the rotated member, and said IC package is secured to the carrier.

14. The electrical connector as claimed in claim 13, wherein the rotated member is equipped with a torsion spring.

15. The electrical connector as claimed in claim 13, wherein the second pivot shaft defines an offset section to press the second end of the load plate, and said offset section is offset from the rotated member without interference therebetween.

16. The electrical connector as claimed in claim 15, wherein the third shaft is located outside the offset section of the second pivot shaft when said second pivot shaft downwardly presses the second end of the load plate.

17. The electrical connector as claimed in claim 11, wherein both said holding member and said load plate define corresponding through openings in a vertical direction perpendicular to both said front-to-back direction and said transverse direction so as to allow the IC package to communicate with an exterior upwardly.

18. An electrical connector comprising:
    an insulative housing defining opposite first and second end region in a front-to-back direction;
    a plurality of contacts disposed in the housing;
    a holding member pivotally mounted around the first end region and configured to secure an IC (Integrated Circuit) package thereto; and
    a load plate pivotally mounted around the second end region and covering the holding member when both said holding member and said load plate are located at corresponding horizontal positions, respectively.

19. The electrical connector as claimed in claim 18, further including a first lever forming a pressing section around the first end region to downwardly press the load plate when said load plate is located at the horizontal position, and a second lever forming a pivot shaft around said first end region to extend along a transverse direction perpendicular to said front-to-back direction, about which said load plate is pivotal.

20. The electrical connector as claimed in claim 18, wherein both said holding member and said load plate define corresponding through openings in a vertical direction perpendicular to both said front-to-back direction and said transverse direction so as to allow the IC package to communicate with an exterior upwardly.

\* \* \* \* \*